United States Patent
Miyake et al.

(10) Patent No.: US 11,479,637 B2
(45) Date of Patent: Oct. 25, 2022

(54) SHEET-SHAPED PREPREG (71) Applicant: DAICEL CORPORATION, Osaka (JP)

(72) Inventors: Hiroto Miyake, Himeji (JP); Kiyoharu Tsutsumi, Tokyo (JP); Ryosuke Ieki, Himeji (JP)

(73) Assignee: DAICEL CORPORATION, Osaka (JP)

( * ) Notice: Subject to any disclaimer, the term of this patent is extended or adjusted under 35 U.S.C. 154(b) by 118 days.

(21) Appl. No.: 16/342,448

(22) PCT Filed: Oct. 3, 2017

(86) PCT No.: PCT/JP2017/035982
§ 371 (c)(1),
(2) Date: Apr. 16, 2019

(87) PCT Pub. No.: WO2018/074221
PCT Pub. Date: Apr. 26, 2018

(65) Prior Publication Data
US 2020/0055979 A1 Feb. 20, 2020

(30) Foreign Application Priority Data
Oct. 17, 2016 (JP) .............................. JP2016-203799

(51) Int. Cl.
| C08G 59/24 | (2006.01) |
| C08J 5/24 | (2006.01) |
| C08G 59/68 | (2006.01) |
| C08G 59/42 | (2006.01) |
| C08G 59/62 | (2006.01) |
| C08G 59/50 | (2006.01) |
| C08K 3/36 | (2006.01) |
| C08K 3/04 | (2006.01) |
| H01L 23/29 | (2006.01) |
| H01L 23/31 | (2006.01) |

(52) U.S. Cl.
CPC ....... C08G 59/245 (2013.01); C08G 59/4238 (2013.01); C08G 59/4284 (2013.01); C08G 59/502 (2013.01); C08G 59/504 (2013.01); C08G 59/621 (2013.01); C08G 59/625 (2013.01); C08G 59/686 (2013.01); C08J 5/245 (2021.05); C08K 3/041 (2017.05); C08K 3/36 (2013.01); C08J 2363/02 (2013.01); C08J 2363/04 (2013.01); C08K 2201/003 (2013.01); C08K 2201/004 (2013.01); C08K 2201/005 (2013.01); C08K 2201/011 (2013.01); H01L 23/29 (2013.01); H01L 23/31 (2013.01)

(58) Field of Classification Search
CPC .............. C08G 59/245; C08G 59/4238; C08G 59/4284; C08G 59/502; C08G 59/504; C08G 59/621; C08G 59/625; C08G 59/686; C08K 3/041; C08K 3/36; C08K 2201/003; C08K 2201/004; C08K 2201/005; C08K 2201/011; C08J 5/24; C08J 2363/02; C08J 2363/04
See application file for complete search history.

(56) References Cited

U.S. PATENT DOCUMENTS

| 6,524,709 | B1 | 2/2003 | Sagara et al. |
| 6,696,155 | B1* | 2/2004 | Takano .................. B32B 27/04 428/391 |
| 6,933,050 | B2 | 8/2005 | Sagara et al. |
| 2003/0162935 | A1 | 8/2003 | Sagara et al. |
| 2010/0044078 | A1* | 2/2010 | Narahashi ............... B32B 38/10 174/250 |
| 2012/0009836 | A1* | 1/2012 | Ueno ...................... B32B 17/04 442/59 |
| 2012/0043123 | A1* | 2/2012 | Takada ................. H05K 3/4602 174/258 |
| 2012/0328858 | A1 | 12/2012 | Fujiwara et al. |

(Continued)

FOREIGN PATENT DOCUMENTS

| JP | 2001-288247 A | 10/2001 |
| JP | 2004-56141 A | 2/2004 |

(Continued)

OTHER PUBLICATIONS

Machine Translation of JP 2009/231222 A (2009) (Year: 2009).*
Wallenberger et al., "Glass Fibers", ASM Handbook, vol. 1: Composites; 2001, p. 2; https://www.asminternational.org/documents/10192/1849770/06781G_p27-34.pdf (Year: 2001).*

(Continued)

Primary Examiner — Callie E Shosho
Assistant Examiner — Bethany M Miller
(74) Attorney, Agent, or Firm — Birch, Stewart, Kolasch & Birch, LLP (57) ABSTRACT Provided is a sheet-like prepreg that has both a low coefficient of linear thermal expansion and high flexibility and offers excellent anti-warpage performance and cracking resistance. The sheet-like prepreg according to the present invention includes a curable composition and a sheet-like porous support impregnated with the curable composition. The sheet-like porous support is made from a material having a coefficient of linear thermal expansion of 10 ppm/K or less. The sheet-like prepreg gives a cured product having a glass transition temperature of −60° C. to 100° C. The curable composition includes one or more curable compounds (A) and at least one of a curing agent (B) and a curing catalyst (C). The curable compounds (A) include an epoxide having a weight per epoxy equivalent of 140 to 3000 g/eq in an amount of 50 weight percent or more of the totality of the curable compounds (A).

18 Claims, 2 Drawing Sheets

(56) References Cited

U.S. PATENT DOCUMENTS

| | | | |
|---|---|---|---|
| 2013/0115440 A1 | | 5/2013 | Hoevel et al. |
| 2016/0362546 A1 | | 12/2016 | Hasegawa et al. |
| 2017/0283565 A1 | * | 10/2017 | Ono .......................... C08J 5/24 |

FOREIGN PATENT DOCUMENTS

| | | | |
|---|---|---|---|
| JP | 2007-326929 A | | 12/2007 |
| JP | 2009-231222 A | | 10/2009 |
| JP | 2009231222 A | * | 10/2009 |
| JP | 2011-256372 A | | 12/2011 |
| JP | 2014-5345 A | | 1/2014 |
| JP | 2015-50447 A | | 3/2015 |
| JP | 2015-52070 A | | 3/2015 |
| JP | 2015-153853 A | | 8/2015 |
| WO | WO 2008/018364 A1 | | 2/2008 |
| WO | WO 2015/146149 A1 | | 10/2015 |

OTHER PUBLICATIONS

International Search Report dated Jan. 9, 2018, in PCT/JP2017/035982.

Written Opinion of the International Searching Authority dated Jan. 9, 2018, in PCT/JP2017/035982.

Extended European Search Report dated May 7, 2020, in European Patent Application No. 17861985.4.

Taiwanese Office Action and Search Report issued in the corresponding Taiwanese Patent Application No. 106134745 dated Mar. 4, 2021.

Chinese Office Action issued tn the corresponding Chinese Patent Application No. 201780063794.8 dated Apr. 18, 2022.

Huang et al., "Surface Assembly Technologies and Chip Components," University of Electronic Science and Technology Press, Sep. 1997, pp. 178-179 (including a partial English translation thereof).

Li. "Chemistry of Plant Fibers," China Light Industry Press, Jun. 2012, pp. 271-273 (including a partial English translation thereof).

* cited by examiner

SHEET-SHAPED PREPREG

TECHNICAL FIELD

The present invention relates to a sheet-shaped (sheet-like) prepreg that is usable as an encapsulant for fan-out wafer-level packaging and as a material for substrate warpage prevention. This application claims priority to Japanese Patent Application No. 2016-203799, filed Oct. 17, 2016 to Japan, the entire contents of which are incorporated herein by reference.

BACKGROUND ART

Fan-out wafer-level packaging (FOWLP), which is a novel technology and production method for semiconductor packages, is a package production technique by which diced semiconductor chips are repositioned and encapsulated on a substrate to give a rebuilt wafer, and the rebuilt wafer is typically rewired and/or provided with ball grid arrays (BGAs), and then diced.

The encapsulation is performed primarily by resin encapsulation using an epoxy resin. Disadvantageously, however, the resin encapsulation suffers from warpage (curling) after packaging, due to cure shrinkage and/or thermal expansion of the resin. This is caused because such encapsulating resin has a larger coefficient of linear thermal expansion as compared with the chips.

In a known technique for preventing warpage by lowering the coefficient of linear thermal expansion of such an encapsulating resin, the encapsulating resin is combined with a large amount of a filler (Patent Literature (PTL) 1). Disadvantageously, however, the addition of a large amount of the filler causes the encapsulating resin to have a significantly higher melt viscosity and to be less usable. Also disadvantageously, the addition causes the encapsulating resin to have lower flexibility, to become stiff and brittle, and to be more susceptible to cracking.

CITATION LIST

Patent Literature

PTL 1: Japanese Unexamined Patent Application Publication (JP-A) No. 2004-56141

SUMMARY OF INVENTION

Technical Problem

Accordingly, the present invention has an object to provide a sheet-like prepreg (sheet-shaped prepreg) that combines a low coefficient of linear thermal expansion with high flexibility and offers excellent anti-warpage performance (warpage resistance) and cracking resistance.

Solution to Problem

After intensive investigations to achieve the object, the inventors of the present invention found that a sheet-like prepreg including a sheet-like porous support impregnated with a curable composition, where the porous support is made from a material having a low coefficient of linear thermal expansion, and the curable composition contains an epoxide having a weight per epoxy equivalent of 140 to 3000 g/eq; and found that the sheet-like prepreg gives a cured product that has a thermal shrinkage percentage and a thermal expansion coefficient at low levels, has appropriate flexibility, and excellently resists warpage and cracking. The present invention has been made on the basis of these findings.

Specifically, the present invention provides, in one aspect, a sheet-like prepreg that includes a sheet-like porous support and a curable composition. The sheet-like porous support is impregnated with the curable composition and is made from a material having a coefficient of linear thermal expansion of 10 ppm/K or less. The sheet-like prepreg gives a cured product that has a glass transition temperature of from −60° C. to 100° C. The curable composition is a composition containing one or more curable compounds (A), and at least one of a curing agent (B) and a curing catalyst (C). The curable compounds (A) include an epoxide having a weight per epoxy equivalent of 140 to 3000 g/eq in an amount of 50 weight percent or more of the totality of the curable compounds (A).

In the sheet-like prepreg, the curable composition may contain the curing agent (B) in such a proportion that a reactive group or groups of the curing agent (B) are present in an amount of 0.8 to 1.2 moles per mole of a curable group or groups of the curable compounds (A).

In the sheet-like prepreg, the curable composition may contain the curing catalyst (C) in a proportion of 0.1 to 10 parts by weight per 100 parts by weight of the curable compound (A).

In the sheet-like prepreg, the curable composition may have a weighted average of the molecular weights per functional group of all the curable compounds (A) (all the curable compounds (A) and all the curing agents (B) when the curable composition also contains one or more curing agents (B)) contained in the curable composition of 180 to 1000 g/eq.

Preferably, in the sheet-like prepreg, a cured product of the curable composition has a coefficient of linear thermal expansion of 100 ppm/K or more, and the cured product of the sheet-like prepreg has a coefficient of linear thermal expansion of 55 ppm/K or less.

In the sheet-like prepreg, the curable composition may further contain a filler (D) in a proportion of 1 to 50 parts by weight per 100 parts by weight of the curable compound (A).

In the sheet-like prepreg, the sheet-like porous support may have a thickness of 5 to 500 μm.

The sheet-like prepreg may be used as an encapsulant for compression molding.

The sheet-like prepreg may also be used as an encapsulant for fan-out wafer-level packaging.

The sheet-like prepreg may also be used as a material for preventing warpage of a thinned silicon chip or thinned substrate having a thickness of 100 μm or less.

Advantageous Effects of Invention

The sheet-like prepreg according to the present invention can give, by heat cure, a cured product that has appropriate flexibility, less shrinks and expands by heat (has a low thermal shrinkage percentage and a low thermal expansion coefficient), and can offer excellent anti-warpage performance and cracking resistance. The sheet-like prepreg according to the present invention is therefore advantageously usable as an encapsulant for FOWLP and as a material for substrate warpage prevention.

DESCRIPTION OF EMBODIMENTS

Sheet-Like Prepreg

The sheet-like prepreg according to the present invention is a sheet-like prepreg including a curable composition, and a sheet-like porous support (sheet-like porous reinforcement) impregnated with the curable composition (the curable composition fills pores or voids of the sheet-like porous support). The sheet-like porous support is made from a material having a coefficient of linear thermal expansion of 10 ppm/K or less. The sheet-like prepreg gives a cured product having a glass transition temperature of from −60° C. to 100° C. The curable composition is a composition that contains one or more curable compounds (A), and at least one of a curing agent (B) and a curing catalyst (C). The curable compounds (A) include an epoxide having a weight per epoxy equivalent of 140 to 3000 g/eq in a content of 50 weight percent or more of the totality of the curable compound (A).

Sheet-Like Porous Support

The sheet-like porous support (hereinafter also abbreviated as "porous support") for use in the present invention is made from a material having a coefficient of linear thermal expansion of 10 ppm/K or less (preferably 7 ppm/K or less, and particularly preferably 5 ppm/K or less), where the coefficient of linear thermal expansion is a coefficient of linear thermal expansion at a temperature in the range of typically −20° C. to 300° C. (preferably −10° C. to 300° C., particularly preferably 0° C. to 300° C., and most preferably 0° C. to 250° C.). The sheet-like prepreg according to the present invention employs the porous support made from a material having a coefficient of linear thermal expansion of 10 ppm/K or less, can thereby have a lower cure shrinkage percentage and a lower coefficient of linear thermal expansion (less shrinks and less expands), less suffers from warpage due to thermal shock application, and resists cracking.

Non-limiting examples of the material having a coefficient of linear thermal expansion of 10 ppm/K or less include paper, celluloses, glass fibers, and liquid crystal materials. In the present invention, among them, paper, celluloses, and glass fibers are preferred, of which celluloses are particularly preferred because of lightweightness and easy availability.

The porous support has a porosity or void percentage of typically 90 to 10 percent by volume, preferably 80 to 30 percent by volume, particularly preferably 70 to 30 percent by volume, and most preferably 70 to 50 percent by volume. The porous support, if having a porosity less than the range, tends to be hardly impregnated with a sufficient amount of the after-mentioned curable composition and to have insufficient surface smoothness. The porous support, if having a porosity greater than the range, tends to hardly offer sufficient reinforcing effects and to thereby impede the sheet-like prepreg from having a low cure shrinkage percentage and a low coefficient of linear thermal expansion.

As used herein, the term "porosity" refers to the volume fraction of pores or voids in the porous support. The porosity of the porous support can be determined by measuring the surface area, thickness, and mass of a sample having a size of 10 cm by 10 cm, and calculating the porosity according to the following equation, wherein, of the porous support, Ar represents the area (cm$^2$); t represents the thickness (cm); W represents the mass (g); and M represents the density of the material constituting the porous support. The thickness (t) of the porous support is determined by measuring the thickness of the porous support at ten different points using a thickness gauge (PDN-20 supplied by PEACOK), averaging the ten measurements, and defining the average as the thickness (t).

$$\text{Porosity (percent by volume)} = \{1 - W/(M \times Ar \times t)\} \times 100$$

The thickness of the porous support is typically 5 to 500 μm. The lower limit of the thickness is preferably 10 μm, particularly preferably 15 μm, and most preferably 20 μm. The upper limit of the thickness is preferably 300 μm, more preferably 200 μm, particularly preferably 100 μm, and most preferably 75 μm. The thickness of the porous support can be adjusted as appropriate within the range. For example, when the curable composition alone gives a cured product having a low glass transition temperature Tg, the sheet-like prepreg can offer a lower cure shrinkage percentage by allowing the porous support to have a smaller thickness. When the curable composition alone gives a cured product having a high glass transition temperature Tg, the sheet-like prepreg can offer a lower coefficient of linear thermal expansion by allowing the porous support to have a larger thickness. The porous support, if having a thickness greater than the range, tends to hardly respond to reduction in size and weight of electronic devices. In contrast, the porous support, if having a thickness less than the range, tends to hardly offer sufficient toughness. In this case, the resulting sheet-like prepreg, typically when used as an encapsulant for FOWLP, tends to hardly offer high strength by packaging; and, when used as a material for warpage prevention, tends to hardly prevent or minimize warpage of thinned silicon chips and thinned substrates.

Curable Composition

The curable composition for use in the present invention is a composition containing one or more curable compounds (A) and at least one of a curing agent (B) and a curing catalyst (C). The curable compound(s) (A) include an epoxide having a weight per epoxy equivalent of 140 to 3000 g/eq in an amount of 50 weight percent or more of the totality of the curable compound(s) (A).

Curable Compounds (A)

The curable compound(s) (A) includes an epoxide having a weight per epoxy equivalent (g/eq) of 140 to 3000 (preferably 170 to 1000, more preferably 180 to 1000, and particularly preferably 180 to 500) in an amount of 50 weight percent or more (preferably 70 weight percent or more, particularly preferably 80 weight percent or more, and most preferably 90 weight percent or more; where the upper limit of the amount is 100 weight percent) of the totality of the curable compound(s) (A). The curable composition, if containing a curable compound or compounds including an excessive amount of a compound having a weight per epoxy equivalent out of the range, gives a cured product that has lower flexibility and offers lower cracking resistance.

Non-limiting examples of the epoxide (epoxy compound) include cycloaliphatic epoxides, aromatic epoxides, and aliphatic epoxides.

Cycloaliphatic Epoxides

Non-limiting examples of the cycloaliphatic epoxides include known or common compounds each having one or more alicycles and one or more epoxy groups. Among them, preferred examples are compounds (1) and (2) as follows.

The compounds (1) are compounds each containing an epoxy group directly bonded through a single bond to an alicycle.

The compounds (2) are compounds each containing an alicycle and a glycidyl ether group in the molecule (glycidyl ether epoxides).

Non-limiting examples of the compounds (1) each containing an epoxy group directly bonded through a single bond to an alicycle include compounds represented by Formula (i):

[Chem. 1]

(i)

In Formula (i), R″ represents a group (p-valent organic group) corresponding to a "p"-hydric alcohol, except for removing "p" hydroxy groups (—OH) from the structural formula of the p-hydric alcohol; and p and n each independently represent a natural number. Non-limiting examples of the p-hydric alcohol ($R''(OH)_p$) include polyhydric alcohols such as 2,2-bis(hydroxymethyl)-1-butanol, of which $C_1$-$C_{15}$ alcohols are typified. The numbers p is preferably from 1 to 6, and n is preferably from 1 to 30. When p is 2 or more, two or more occurrences of n in the groups in the brackets (outer square brackets) may be identical or different. Specifically, examples of the compounds represented by Formula (i) include an 1,2-epoxy-4-(2-oxiranyl)cyclohexane adduct of 2,2-bis(hydroxymethyl)-1-butanol (such as EHPE 3150 (trade name, supplied by Daicel Corporation)).

Non-limiting examples of the compounds (2) each containing an alicycle and a glycidyl ether group in the molecule include glycidyl ethers of alicyclic alcohols (in particular, of alicyclic polyhydric alcohols). More specifically, non-limiting examples of the compounds (2) include 2,2-bis[4-(2,3-epoxypropoxy)cyclohexyl]propane, 2,2-bis[3,5-dimethyl-4-(2,3-epoxypropoxy)cyclohexyl]propane, and other hydrogenated bisphenol-A epoxides, which are compounds resulting from hydrogenation of bisphenol-A epoxides; bis[o,o-(2,3-epoxypropoxy)cyclohexyl]methane, bis[o,p-(2,3-epoxypropoxy)cyclohexyl]methane, bis[p,p-(2,3-epoxypropoxy)cyclohexyl]methane, bis[3,5-dimethyl-4-(2,3-epoxypropoxy)cyclohexyl]methane, and other hydrogenated bisphenol-F epoxides, which are compounds resulting from hydrogenation of bisphenol-F epoxides; hydrogenated biphenol epoxides; hydrogenated phenol novolac epoxides; hydrogenated cresol novolac epoxides; hydrogenated cresol novolac epoxides of bisphenol-A; hydrogenated naphthalene epoxides; and compounds resulting from hydrogenation of epoxides derived from trisphenolmethane.

Aromatic Epoxides

Non-limiting examples of the aromatic epoxides include epi-bis glycidyl ether epoxy resins resulting from condensation between an epihalohydrin and a bisphenol (such as bisphenol-A, bisphenol-F, bisphenol-S, or fluorene-bisphenol); high-molecular-weight epi-bis glycidyl ether epoxy resins resulting from addition reaction of these epi-bis glycidyl ether epoxy resins further with the bisphenol; after-mentioned modified epi-bis glycidyl ether epoxy resins; novolac-alkyl glycidyl ether epoxy resins resulting from condensation between a phenol (such as phenol, cresol, xylenol, resorcinol, catechol, bisphenol-A, bisphenol-F, or bisphenol-S) and an aldehyde (such as formaldehyde, acetaldehyde, benzaldehyde, hydroxybenzaldehyde, or salicylaldehyde) to give polyhydric alcohols, and further condensation between the polyhydric alcohols and the epihalohydrin; and epoxides each having a fluorene ring to which two phenol skeletons are bonded at the 9-position, in which glycidyls are independently bonded directly or through an alkyleneoxy group to oxygen atoms resulting from removal of hydrogen atoms from the hydroxy groups of the two phenol skeletons.

Non-limiting examples of the modified epi-bis glycidyl ether epoxy resins include compounds represented by Formula (ii). In Formula (ii), $R^1$ to $R^4$ each represent, identically or differently in each occurrence, hydrogen or a hydrocarbon group; k represents an integer of 1 or more; $L^1$ represent, independently in each occurrence, a low-polarity linking group; and $L^2$ represents a flexible skeleton. Formula (ii) is expressed as follows:

[Chem. 2]

(ii)

Non-limiting examples of the hydrocarbons include aliphatic hydrocarbon groups, alicyclic hydrocarbon groups, aromatic hydrocarbon groups, and groups resulting from combining two or more of these groups.

Of the aliphatic hydrocarbon groups, preferred are $C_1$-$C_{20}$ aliphatic hydrocarbon groups, which are exemplified typically by alkyls having 1 to about 20 (preferably 1 to 10, and particularly preferably 1 to 3) carbon atoms, such as methyl, ethyl, propyl, isopropyl, butyl, isobutyl, s-butyl, t-butyl, pentyl, hexyl, decyl, and dodecyl; alkenyls having 2 to about 20 (preferably 2 to 10, and particularly preferably 2 or 3) carbon atoms, such as vinyl, allyl, and 1-butenyl; and alkynyls each having 2 to about 20 (preferably 2 to 10, and particularly preferably 2 or 3) carbon atoms, such as ethynyl and propynyl.

Of the alicyclic hydrocarbon groups, preferred are alicyclic hydrocarbon groups having 3 to 10 members, which are exemplified typically by cycloalkyls having 3 to about 8 members (preferably 5 to 8 members), such as cyclopropyl, cyclobutyl, cyclopentyl, cyclohexyl, and cyclooctyl.

Of the aromatic hydrocarbon groups, preferred are aromatic hydrocarbon groups having 6 to 14 (preferably 6 to 10) carbon atoms, which are exemplified typically by phenyl.

Among them, the groups $R^1$ to $R^4$ are each independently preferably selected from aliphatic hydrocarbon groups (and particularly preferably selected from alkyls).

The groups $L^1$s represent, independently in each occurrence, a low-polarity linking group and are exemplified typically by $C_1$-$C_3$ linear or branched chain alkylenes such as methylene, methylmethylene, dimethylmethylene, and ethylene.

The group $L^2$ represents a flexible skeleton and is exemplified typically by $C_2$-$C_4$ oxyalkylenes such as oxyethylene, oxypropylene, oxybutylene, and oxytetramethylene.

Such a modified epi-bis glycidyl ether epoxy resin has the configuration and, when added to the curable composition, effectively allows the curable composition to offer better cracking resistance.

Of the modified epi-bis glycidyl ether epoxy resins, a compound represented by Formula (ii-1) is advantageously usable. The compound represented by Formula (ii-1) for use in the present invention is available as commercial products such as EPICLON EXA-4850-1000 (trade name, supplied by DIC Corporation, having a weight per epoxy equivalent of 350) and EPICLON EXA-4850-150 (trade name, supplied by DIC Corporation, having a weight per epoxy equivalent of 433). Formula (ii-1) is expressed as follows:

[Chem. 3]

(ii-1)

Aliphatic Epoxides

Non-limiting examples of the aliphatic epoxides include glycidyl ethers of q-hydric alcohols having no cyclic structure, where q is a natural number; glycidyl esters of monovalent or poly-valent carboxylic acids (such as acetic acid, propionic acid, butyric acid, stearic acid, adipic acid, sebacic acid, maleic acid, and itaconic acid); epoxidized products of fats and oils having a double bond, such as epoxidized linseed oil, epoxidized soybean oil, and epoxidized castor oil; and epoxidized products of polyolefins (including polyalkadienes), such as epoxidized polybutadienes. Non-limiting examples of the q-hydric alcohols having no cyclic structure include monohydric alcohols such as methanol, ethanol, 1-propyl alcohol, isopropyl alcohol, and 1-butanol; divalent alcohols such as ethylene glycol, 1,2-propanediol, 1,3-propanediol, 1,4-butanediol, neopentyl glycol, 1,6-hexanediol, diethylene glycol, triethylene glycol, tetraethylene glycol, dipropylene glycol, polyethylene glycols, and polypropylene glycols; and trihydric or higher polyhydric alcohols such as glycerol, diglycerol, erythritol, trimethylolethane, trimethylolpropane, pentaerythritol, dipentaerythritol, and sorbitol. The q-hydric alcohol may also be selected typically from polyether polyols, polyester polyols, polycarbonate polyols, and polyolefin polyols.

Curing Agent (B)

The curing agent (B) constituting the curable composition for use in the present invention is a compound having the function of curing epoxides.

The curing agent (B) can be selected from curing agents known or commonly used as curing agents for epoxy resins. Non-limiting examples of the curing agent (B) include acid anhydrides, dicarboxylic acids, amines, polyamide resins, imidazoles, polymercaptans, phenols, polycarboxylic acids, dicyandiamides, and organic acid hydrazides. Among them, at least one compound selected from the group consisting of (b-1) acid anhydrides, (b-2) dicarboxylic acids, (b-3) amines, and (b-4) phenols is preferred in the present invention. These are preferred for providing excellent reliability.

The curing agent (B) has a molecular weight per functional group of typically 10 to 10000 g/eq (preferably 20 to 8000 g/eq, more preferably 20 to 7000 g/eq, furthermore preferably 20 to 5000 g/eq, particularly preferably 20 to 2000 g/eq, and most preferably 20 to 1000 g/eq).

Non-limiting examples of the acid anhydrides (b-1) include methyltetrahydrophthalic anhydrides (such as 4-methyltetrahydrophthalic anhydride and 3-methyltetrahydrophthalic anhydride), methylhexahydrophthalic anhydrides (such as 4-methylhexahydrophthalic anhydride and 3-methylhexahydrophthalic anhydride), dodecenylsuccinic anhydride, methyl-endomethylenetetrahydrophthalic anhydride, phthalic anhydride, maleic anhydride, tetrahydrophthalic anhydride, hexahydrophthalic anhydride, methylcyclohexenedicarboxylic anhydride, pyromellitic anhydride, trimellitic anhydride, benzophenonetetracarboxylic anhydride, nadic anhydride, methylnadic anhydride, hydrogenated methylnadic anhydride, 4-(4-methyl-3-pentenyl)tetrahydrophthalic anhydride, succinic anhydride, adipic anhydride, sebacic anhydride, dodecanedioic anhydride, methylcyclohexenetetracarboxylic anhydride, vinyl ether-maleic anhydride copolymers, and alkylstyrene-maleic anhydride copolymers. Among them, preferred are acid anhydrides that are liquid at 25° C., such as methyltetrahydrophthalic anhydride, methylhexahydrophthalic anhydride, dodecenylsuccinic anhydride, and methyl-endomethylenetetrahydrophthalic anhydride. These are preferred from the viewpoint of handleability. Of such acid anhydride curing agents, preferred are anhydrides of saturated monocyclic hydrocarbon dicarboxylic acids (including those containing a substituent, such as alkyl, bonded to the ring). These are preferred for providing particularly excellent cracking resistance.

Such acid anhydrides (b-1) for use herein are advantageously available as commercial products such as RIKACID MH-700F (trade name, supplied by New Japan Chemical Co., Ltd.) and HN-5500 (trade name, supplied by Hitachi Chemical Company, Ltd.).

Non-limiting examples of the dicarboxylic acids (b-2) include aromatic dicarboxylic acids such as 4,4'-biphenyldicarboxylic acid, 2,2'-biphenyldicarboxylic acid, phthalic acid, isophthalic acid, and terephthalic acid; aliphatic dicarboxylic acids such as oxalic acid, malonic acid, succinic acid, adipic acid, 1,6-hexanedicarboxylic acid, 1,2-cyclohexanedicarboxylic acid, 1,3-cyclohexanedicarboxylic acid, and 1,4-cyclohexanedicarboxylic acid; and ester-type dicarboxylic acids resulting from reaction between an acid anhydride and a polyol compound. Among them, preferred are ester-type dicarboxylic acids resulting from reaction between an acid anhydride and a polyol compound.

The acid anhydride for use in the synthesis of the ester-type dicarboxylic acids is preferably selected from alicyclic acid anhydrides, of which 4-methylhexahydrophthalic anhydride and hexahydrophthalic anhydride are particularly preferred.

The polyol compound is preferably selected from dihydric or trihydric aliphatic alcohols and is exemplified typically by dihydric aliphatic alcohols such as ethylene glycol, diethylene glycol, triethylene glycol, 1,4-butanediol, 1,6-hexanediol, 1,10-decanediol, neopentyl glycol, dimethylolpropane, and poly-$C_1$-$C_5$ alkylene glycols (such as polyethylene glycols and polypropylene glycols); and trihydric aliphatic alcohols such as glycerol and trimethylolpropane.

Among them, divalent aliphatic alcohols are preferred, of which poly-$C_1$-$C_5$ alkylene glycols are more preferred. The poly-$C_1$-$C_5$ alkylene glycols each have a weight average molecular weight of typically 500 to 2000, and preferably 600 to 1600.

The ester-type dicarboxylic acids resulting from reaction between an acid anhydride and a polyol compound are preferably selected from compounds represented by Formula (b-2-1):

[Chem. 4]

(b-2-1)

In Formula (b-2-1), $R^5$ and $R^6$ represent, identically or differently in each occurrence, $C_1$-$C_5$ alkyl and are each preferably selected from methyl and ethyl; $m^1$ and $m^2$ each represent, identically or differently, an integer of 0 to 4; and L represents a group (divalent group) resulting from removal of two hydroxy groups from a polyol compound. L is preferably selected from groups resulting from removal of two hydroxy groups from a polyethylene glycol or a polypropylene glycol.

Such dicarboxylic acids (b-2) for use herein are advantageously available as commercial products such as RIKACID HF-08 (trade name, supplied by New Japan Chemical Co., Ltd.).

Non-limiting examples of the amines (b-3) include aliphatic polyamines such as ethylenediamine, diethylenetriamine, triethylenetetramine, tetraethylenepentamine, dipropylenediamine, diethylaminopropylamine, and polypropylenetriamines; alicyclic polyamines such as menthenediamine, isophoronediamine, bis(4-amino-3-methyldicyclohexyl)methane, diaminodicyclohexylmethane, bis(aminomethyl)cyclohexane, N-aminoethylpiperazine, and 3,9-bis(3-aminopropyl)-3,4,8,10-tetraoxaspiro[5,5]undecane; and aromatic polyamines including monocyclic polyamines such as m-phenylenediamine, p-phenylenediamine, tolylene-2,4-diamine, tolylene-2,6-diamine, mesitylene-2,4-diamine, 3,5-diethyltolylene-2,4-diamine, and 3,5-diethyltolylene-2,6-diamine, and other polyamines such as biphenylenediamine, 4,4-diaminodiphenylmethane, 2,5-naphthylenediamine, and 2,6-naphthylenediamine.

Non-limiting examples of the phenols (b-4) include aralkyl resins such as novolac phenol resins, novolac cresol resins, p-xylylene-modified phenol resins, and p-xylylene/m-xylylene-modified phenol resins; and other phenyl resins such as terpene-modified phenol resins, dicyclopentadiene-modified phenol resins, and triphenolpropane.

Curing Catalyst (C)

The curable composition for use in the present invention may include a curing catalyst (C) instead of, or in combination with the curing agent (B). The curing catalyst (C), when used, facilitates the curing reaction of epoxides to give a cured product. Examples of the curing catalyst (C) usable herein include, but are not limited to, cationic catalysts (cationic initiators) that can form cationic species typically by ultraviolet irradiation or heat treatment, to initiate polymerization. The curing catalyst (C) may include each of different cationic catalysts alone or in combination.

Non-limiting examples of the cationic catalysts that form cationic species by ultraviolet irradiation include hexafluoroantimonate salts, pentafluorohydroxyantimonate salts, hexafluorophosphate salts, and hexafluoroarsenate salts. The cationic catalysts are available as commercial products such as UVACURE 1590 (trade name, supplied by DAICEL-CYTEC Company, Ltd.); CD-1010, CD-1011, and CD-1012 (trade names, supplied by Sartomer USA, LLC); Irgacure 264 (trade name, supplied by Ciba Japan K.K.); and CIT-1682 (trade name, supplied by Nippon Soda Co., Ltd.).

Non-limiting examples of the cationic catalysts that form cationic species by heat treatment include aryldiazonium salts, aryliodonium salts, arylsulfonium salts, and allene-ion complexes. The cationic catalysts are available as commercial products such as PP-33, CP-66, and CP-77 (trade names, supplied by ADEKA CORPORATION); FC-509 (trade name, supplied by 3M Company); UVE 1014 (trade name, supplied by General Electric Company (GE)); San-Aid SI-60L, San-Aid SI-80L, San-Aid SI-100L, San-Aid SI-110L, and San-Aid SI-150L (trade names, supplied by SANSHIN CHEMICAL INDUSTRY CO., LTD.); and CG-24-61 (trade name, supplied by Ciba Japan K.K.). Non-limiting examples of the cationic catalysts usable herein also include compounds between a chelate compound and a silanol (such as triphenylsilanol), where the chelate compound is formed between a metal (such as aluminum or titanium) and acetoacetic acid or a diketone; and compounds between a chelate compound and a phenol (such as bisphenol-S), where the chelate compound is formed between a metal (such as aluminum or titanium) and acetoacetic acid or a diketone.

Filler (D)

The curable composition for use in the present invention may further include one or more of fillers (D). The curable composition, when containing the filler(s) (D), can offer a still lower cure shrinkage percentage and a still lower coefficient of linear thermal expansion and can more effectively resist (or restrain) warpage. When containing the filler(s) (D), the curable composition, which fills the pores or voids of the porous support, advantageously resists flowing out of the pores.

Non-limiting examples of the filler (D) include oxides including silica (such as natural silica and synthetic silica), aluminum oxides (such as α-alumina), titanium oxides, zirconium oxide, magnesium oxide, cerium oxides, yttrium oxide, calcium oxide, zinc oxide, and iron oxides; carbonates such as calcium carbonate and magnesium carbonate; sulfates such as barium sulfate, aluminum sulfate, and calcium sulfate; nitrides such as aluminum nitride, silicon nitride, titanium nitride, and boron nitride; hydroxides such as calcium hydroxide, aluminum hydroxide, and magnesium hydroxide; and other fillers such as mica, talc, kaolin, kaolin clay, kaolinite, halloysite, pyrophyllite, montmorillonite, sericite, amesite, bentonite, asbestos, wollastonite, sepiolite, xonotlite, zeolite, hydrotalcite, fly ash, dewatered sludge, glass beads, glass fibers, diatomaceous earth, silica sand, carbon black, sendust, alnico magnet, ferrites and other magnetic powders, hydrated gypsum, alum, antimony trioxide, magnesium oxysulfate, silicon carbide, potassium titanate, calcium silicate, magnesium silicate, aluminum silicate, magnesium phosphate, copper, and iron. Non-limiting examples of such fillers usable herein also include carbonaceous materials such as single-layer or multilayer carbon nanotubes, graphene, and graphene oxides. The fillers may have any of structures such as solid structure, hollow structure, and porous structure. The fillers may also be those undergone a surface treatment with a known surface preparation agent, which is exemplified typically by organosilicon compounds such as organohalosilanes, organoalkoxysilanes, and organosilazanes.

Non-limiting examples of the shape or form of the filler (D) include globular (such as fine spherical, approximately spherical, and ellipsoidal) shapes, polyhedral shapes, rodlike (such as cylindrical and prismatic) shapes, tabular shapes, scaly shapes, and amorphous shapes.

The filler (D) has an average particle diameter of typically 5 nm to 100 μm, preferably 50 nm to 50 μm, and particularly preferably 100 nm to 30 μm. The curable composition, if containing a filler having an average particle diameter less than the range, tends to have significantly higher viscosity and to be hard to handle. In contrast, the curable composition, if containing a filler having an average particle diameter greater than the range, tends to offer lower cracking resistance. The curable composition may contain a mixture of two or more different fillers having sizes within the range. This configuration enables control of viscosity and physical properties. The average particle diameter of the inorganic filler herein is a median diameter (d50) determined by laser diffraction scattering analysis.

Curing Accelerator

The curable composition for use in the present invention may contain a curing accelerator in combination with the curing agent (B). The curing accelerator, when contained in combination with the curing agent (B), advantageously accelerates curing (contributes to a higher curing rate). The curing accelerator may be selected from known or common curing accelerators without limitation, but is exemplified typically by 1,8-diazabicyclo[5.4.0]undecene-7 (DBU) and salts thereof (such as a phenol salt, octanoic acid salt, p-toluenesulfonic acid salt, formic acid salt, and tetraphenylborate salt); 1,5-diazabicyclo[4.3.0]nonene-5 (DBN), and salts thereof (such as a phenol salt, octanoic acid salt, p-toluenesulfonic acid salt, formic acid salt, and tetraphenylborate salt); tertiary amines such as benzyldimethylamine, 2,4,6-tris(dimethylaminomethyl)phenol, and N,N-dimethylcyclohexylamine; imidazoles such as 2-ethyl-4-methylimidazole and 1-cyanoethyl-2-ethyl-4-methylimidazole; phosphoric esters, and phosphines such as triphenylphosphine (TPP); phosphonium compounds such as tetraphenylphosphonium tetraphenylborate and tetraphenylphosphonium tetra(p-tolyl)borate; organometallic salts such as tin octoate and zinc octoate; and metal chelates. The curable composition may contain each of them alone or in combination.

The curing accelerator for use herein is advantageously available as commercial products such as U-CAT SA 506, U-CAT SA 102, U-CAT 5003, U-CAT 18X, and U-CAT 12XD (trade names, supplied by San-Apro Ltd.); TPP-K and TPP-MK (trade names, supplied by Hokko Chemical Industry Co., Ltd.); and PX-4ET (trade name, supplied by Nippon Chemical Industrial Co., Ltd.).

The curable composition for use in the present invention contains the curable compound (A) in a content of typically 30 to 98 weight percent of the totality of the curable composition. The curable composition for use in the present invention may contain an aromatic epoxide or epoxides in a content of typically 30 to 98 weight percent of the totality of the curable composition. The aromatic epoxides are exemplified typically by compounds selected from epi-bis glycidyl ether epoxy resins, high-molecular-weight epi-bis glycidyl ether epoxy resins, and modified epi-bis glycidyl ether epoxy resin. The curable composition for use in the present invention may have a proportion of epoxides other than aromatic epoxides of typically 20 weight percent or less, preferably 10 weight percent or less, particularly preferably 5 weight percent or less, and most preferably 1 weight percent or less, of the totality of the curable composition.

The aromatic epoxide or epoxides may be present in a proportion of typically 60 weight percent or more, preferably 70 weight percent or more, particularly preferably 80 weight percent or more, and most preferably 90 weight percent or more, of the totality of all epoxides contained in the curable composition for use in the present invention, where the aromatic epoxides are exemplified typically by compounds selected from epi-bis glycidyl ether epoxy resins, high-molecular-weight epi-bis glycidyl ether epoxy resins, and modified epi-bis glycidyl ether epoxy resins. The upper limit of the proportion is 100 weight percent. Accordingly, epoxides other than aromatic epoxides may be present, if any, in a proportion of typically 40 weight percent or less, preferably 30 weight percent or less, particularly preferably 20 weight percent or less, and most preferably 10 weight percent or less, of the totality of all epoxides contained in the curable composition for use in the present invention.

Assume that the curable composition includes the curing agent (B). In this case, the curable composition preferably includes the curing agent (B) in such a proportion that a reactive group or groups of the curing agent (B) is present in a proportion of 0.8 to 1.2 moles per mole of a curable group or groups of the curable compound (A). As used herein, the term "curable group" refers to a curable functional group of the curable compound (A). The curable group of the curable compound (A) is not limited, but is exemplified typically by epoxy group (when the curable compound (A) is an epoxide). Also as used herein, the term "reactive group" refers to a functional group of the curing agent (B), where the functional group is reactive with the "curable group" of the curable compound (A). The reactive group of the curing agent (B) is exemplified typically by, but not limited to, acid anhydride groups which are reactive groups of the acid anhydrides (b-1); carboxy groups which are reactive groups of the dicarboxylic acids (b-2); amino groups which are reactive groups of the amines (b-3); and hydroxy groups which are reactive groups of the phenols (b-4).

The curable composition for use in the present invention may have a total content of the curable compound (A) and the curing agent (B) of typically 80 weight percent or more, preferably 90 weight percent or more, and particularly preferably 95 weight percent or more, of the totality of the curable composition (excluding the filler (D)).

The curable composition, if having a content of the curing agent (B) less than the range, tends to be cured insufficiently and to give a cured product that has lower toughness. In contrast, the curable composition, if having a content of the curing agent (B) greater than the range, may cause the cured product derived from the curable composition alone to have higher polarity and to be more susceptible to moisture, and this may lead to lower reliability.

The curable composition for use in the present invention has a weighted (proportion-weighted) average of molecular weights per functional group (g/eq) of all curable compounds (A) (all curable compounds (A) and all curing agents (B) when the curable composition also contains one or more curing agents (B)) contained in the curable composition of typically 180 to 1000, preferably 200 to 700, particularly preferably 200 to 500, especially preferably 250 to 450, and most preferably 300 to 450. The curable compound(s) (A) (the curable compound(s) (A) and the curing agent(s) (B) when the curable composition also contains one or more curing agents (B)) to be contained in the curable composition for use in the present invention is preferably selected so that the weighted average falls within the range. This is preferred because the resulting curable composition has crosslinking points disposed at appropriate intervals and can give a cured product that has flexibility and excellent cracking resistance. The curable composition, if having a weighted average less than the range, tends to give a cured product that has lower flexibility and lower cracking resistance. In contrast, the curable composition, if having a weighted average greater than the range, tends to give a cured resin that has a lower density and hardly has sufficient toughness and/or weatherability. The "molecular weight per functional group" of an epoxide refers to a weight per epoxy equivalent (epoxy equivalent). The "molecular weight per functional group" of an acid anhydride (b-1), when used as the curing agent, refers to an acid anhydride equivalent. The "molecular weight per functional group" of a dicarboxylic acid (b-2) refers to a carboxyl equivalent. The "molecular weight per functional group" of an amine (b-3) refers to an amine equivalent. The "molecular weight per functional group" of a phenol (b-4) refers to a hydroxyl equivalent.

The curable composition may contain the curing catalyst (C) in a proportion or content not limited, but preferably typically 0.1 to 10 parts by weight per 100 parts by weight of the curable compound(s) (A) contained in the curable composition; and preferably typically 0.01 to 15 parts by weight, preferably 0.01 to 12 parts by weight, more preferably 0.05 to 10 parts by weight, and particularly preferably 0.1 to 10 parts by weight, per 100 parts by weight of the totality of all epoxides contained in the curable composition. The curable composition, when containing the curing catalyst (C) in a proportion within the range, can give a cured product that has excellent heat resistance and weatherability.

The curable composition may contain the filler (D) in a content of typically 50 parts by weight or less (e.g., 1 to 50 parts by weight), preferably 45 parts by weight or less, and particularly preferably 40 parts by weight or less, per 100 parts by weight of the curable compound contained in the curable composition (when two or more different curable compounds are contained, the totality thereof). The curable composition, if containing the filler (D) in an excessively high content, tends to cause the cured product of the curable composition alone to have a higher glass transition temperature Tg, to have lower flexibility, and to offer lower cracking resistance.

The curable composition may contain the curing accelerator in a proportion of not limited, but typically 3 parts by weight or less (typically 0.1 to 3 parts by weight), preferably 0.2 to 3 parts by weight, and particularly preferably 0.25 to 2.5 parts by weight, per 100 parts by weight of epoxides contained in the curable composition.

Other Components

The curable composition for use in the present invention may further contain, in addition to the components, one or more other components as needed.

The curable composition for use in the present invention may contain one or more curable compounds other than epoxides. Non-limiting examples of such other curable compounds usable herein include cationically curable compounds such as oxetane compounds; and radically curable compounds such as (meth)acrylates and urethane (meth) acrylates.

The curable composition for use in the present invention may further contain any other components such as diluents, antifoaming agents, leveling agents, silane coupling agents, surfactants, flame retardants, colorants, plasticizers, antistatic agents, release agents, antioxidants, ultraviolet absorbers, photostabilizers, ion adsorbents, and fluorophors (phosphors).

An acid anhydride, when used as the curing agent (B), is preferably used in combination with a hydroxy-containing compound so as to effectively accelerate the curing reaction. Non-limiting examples of the hydroxy-containing compound include ethylene glycol, diethylene glycol, propylene glycol, and glycerol. The hydroxy-containing compound may be present in a proportion of typically 0.1 to 15 parts by weight, and preferably 0.5 to 10 parts by weight, per 100 parts by weight of the acid anhydride.

The curable composition for use in the present invention can be prepared by mixing the components. The mixing may be performed using a commonly known mixing or blending device. Non-limiting examples of the mixing or blending device include planetary centrifugal mixers, homogenizers, planetary mixers, triple roll mills, and bead mills. The individual components may be mixed at once or one after another.

The cured product of the curable composition for use in the present invention alone (excluding the porous support) has a glass transition temperature (Tg) of typically −60° C. to 100° C. Of the glass transition temperature Tg, the upper limit is preferably 50° C., particularly preferably 40° C., and most preferably 25° C.; and the lower limit is preferably −40° C., more preferably −30° C., furthermore preferably −20° C., still more preferably −10° C., particularly preferably 0° C., especially preferably 5° C., and most preferably 10° C. The cured product of the curable composition for use in the present invention alone (excluding the porous support) has a coefficient of linear thermal expansion of typically 100 ppm/K or more (e.g., 100 to 700 ppm/K, preferably 200 to 500 ppm/K, and particularly preferably 300 to 500 ppm/K) at at least one temperature in the range of equal to or higher than the glass transition temperature (typically −10° C. to 220° C., preferably 0° C. to 220° C., particularly preferably 10° C. to 200° C., especially preferably 20° C. to 220° C., and most preferably 50° C. to 220° C.)

Sheet-Like Prepreg

The sheet-like prepreg according to the present invention structurally includes the curable composition, and the porous support impregnated with the curable composition (pores of the porous support are filled with the curable composition). The cured product of the curable composition for use in the present invention alone has a low glass transition temperature as described above, is flexible, and has excellent cracking resistance. The curable composition, which gives the flexible cured product (in particular, flexible in a high-temperature region of 100° C. or higher), fills the pores of the porous support. This configuration contributes to a lower coefficient of linear thermal expansion and to less or no warpage. This is probably because the porous support confines and impedes the curable composition from expanding.

The sheet-like prepreg according to the present invention can be produced typically by diluting the curable composition with a solvent (such as 2-butanone) to give a solution, impregnating the porous support with the solution, and drying the resulting article to remove the solvent, followed by, as needed, semi-curing (curing of part of the curable compound(s)).

The way to impregnate the porous support with the curable composition is not limited, and is exemplified typically by the technique of immersing the porous support in the curable composition. The immersion may be performed at a temperature of typically about 25° C. to about 60° C., for a duration of typically about 30 seconds to about 30 minutes. The immersion is preferably performed in an environment under reduced pressure or under pressure (under a load). This is preferred for restraining bubbles from remaining and for accelerating filling of the curable composition.

The drying and semi-curing after the impregnation are preferably performed under such conditions as to be adjusted appropriately according to the type of the curing agent to be used. For example, when an acid anhydride or a phenol is used as the curing agent, the drying and semi-curing can be performed by heating at a temperature of lower than 100° C. (e.g., from 25° C. to lower than 100° C.) for about one minute to about one hour. When an amine is used as the curing agent, the drying and semi-curing are preferably performed at a lower temperature. The drying and semi-curing, when performed by heating at a temperature higher than the range and/or for a time longer than the range, the sheet-like prepreg may be hardly used as an encapsulant, because the curing reaction of the curable composition proceeds excessively.

The porous support is present in the sheet-like prepreg according to the present invention in a proportion of typically 10 to 90 percent by volume, preferably 20 to 70 percent by volume, particularly preferably 30 to 70 percent by volume, and most preferably 30 to 50 percent by volume, of the total volume of the sheet-like prepreg. In other words, the curable composition is present in the sheet-like prepreg according to the present invention in a proportion of typically 10 to 90 percent by volume, preferably 30 to 80 percent by volume, particularly preferably 30 to 70 percent by volume, and most preferably 50 to 70 percent by volume, of the total volume of the sheet-like prepreg. The porous support, if present in a proportion greater than the range, tends to be hardly impregnated with a sufficient amount of the curable composition and to hardly provide surface smoothness. In contrast, the curable composition, if present in a proportion greater than the range, tends to fail to enjoy the reinforcing effect by the porous support and tends to hardly contribute to a lower cure shrinkage percentage and a lower coefficient of linear thermal expansion.

The sheet-like prepreg according to the present invention forms, by heat treatment, a cured product. The heat treatment may be performed under conditions not limited, but is performed by heating at a temperature of preferably 40° C. to 300° C., and more preferably 60° C. to 250° C. The heating time can be adjusted as appropriate according to the heating temperature, is not limited, but is preferably 1 to 10 hours, and more preferably 1 to 5 hours. The heat treatment may be performed at a constant heating temperature or continuously or stepwise varying heating temperatures.

The cured product of the sheet-like prepreg according to the present invention has a glass transition temperature (Tg) of from −60° C. to 100° C. (between −60° C. and 100° C. inclusive), preferably 0° C. to 90° C., more preferably 5° C. to 80° C., furthermore preferably 10° C. to 75° C., particularly preferably 10° C. to 60° C., still more preferably 10° C. to 50° C., furthermore preferably 10° C. to 40° C., and especially preferably 15° C. to 40° C. The cured product of the sheet-like prepreg according to the present invention, as having a glass transition temperature Tg within the range, has appropriate flexibility and offers excellent cracking resistance. The glass transition temperature of the cured product may be determined by the method described in working examples.

The cured product of the sheet-like prepreg according to the present invention has a coefficient of linear thermal expansion of typically 55 ppm/K or less (e.g., −1 to 55 ppm/K), preferably 50 ppm/K or less, more preferably 45 ppm/K or less, furthermore preferably 25 ppm/K or less, and particularly preferably 20 ppm/K or less, where the coefficient of linear thermal expansion is a coefficient of linear thermal expansion at a temperature of typically −20° C. to 300° C., preferably −10° C. to 300° C., and particularly preferably 0° C. to 300° C. This configuration allows the cured product to less expand and contract by heat and to resist warping. Namely, the cured product offers excellent anti-warpage performance (excellent warpage resistance).

The sheet-like prepreg according to the present invention is advantageously usable as an encapsulant for compression molding (in particular, as an encapsulant for FOWLP).

Figure 1:
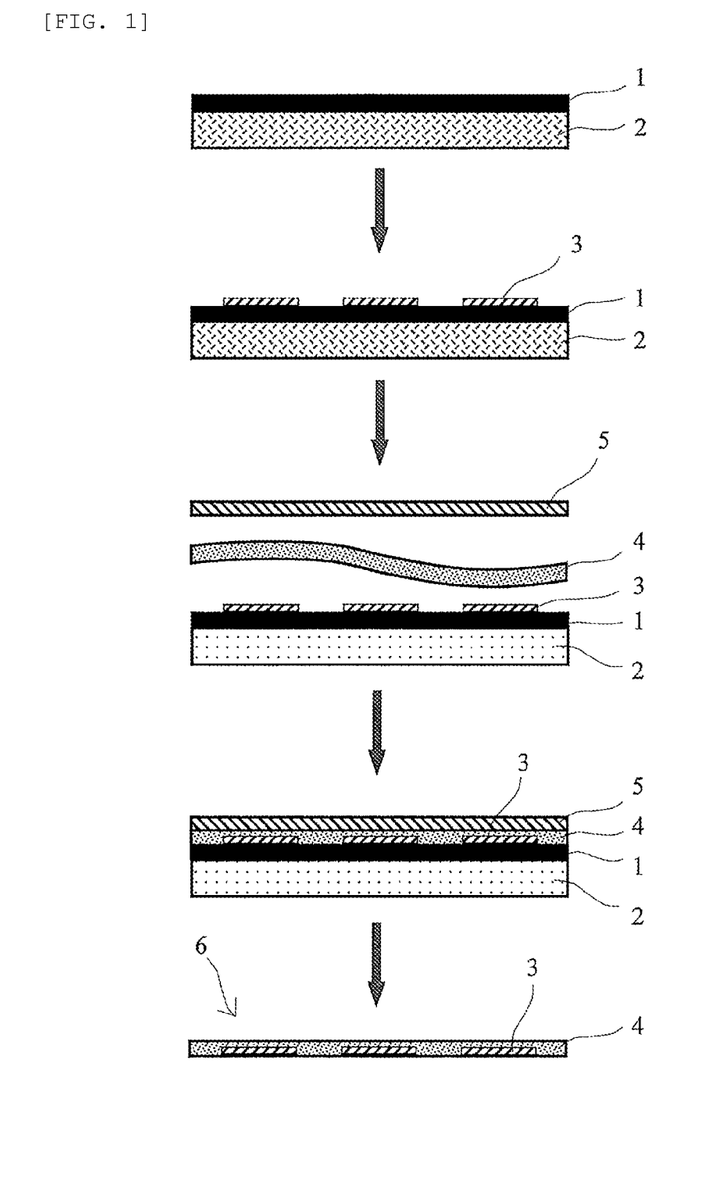
FIG. 1 is a schematic diagram illustrating how to produce a FOWLP using a sheet-like prepreg according to an embodiment of the present invention.

A representative, but non-limiting example of the method for producing a FOWLP using the sheet-like prepreg according to the present invention includes Steps I, II, III, and IV as follows (see FIG. 1).

Step I is the step of applying a temporary tape (temporary bonding tape) to a backing, and applying semiconductor chips through the temporary tape to the backing.

Step II is the step of encapsulating the semiconductor chips using the sheet-like prepreg according to the present invention.

Step III is the step of removing the backing.

Step IV is the step of performing rewiring, electrode formation, and dicing to give a semiconductor package.

The encapsulation of the chips using the sheet-like prepreg according to the present invention in Step II may be performed by laminating the sheet-like prepreg according to the present invention on the chips, compressing (typically by pressing at 0.1 to 5 MPa) the laminate typically using a surface flattening substrate, and subjecting the compressed laminate to heat treatment by the procedure mentioned above.

The rewiring and electrode formation in Step IV can be performed by well-known, common techniques. The rewiring and electrode formation are performed in a high-temperature environment at about 200° C. Even in such a high-temperature environment, the cured product of the sheet-like prepreg according to the present invention less suffers from warpage and cracking caused by stress derived from the difference in coefficient of thermal expansion from the semiconductor chips. This is because the cured product has a coefficient of linear thermal expansion within the range and thereby has a smaller difference in coefficient of thermal expansion from the semiconductor chips.

Assume that the sheet-like prepreg according to the present invention is applied to at least one side of a silicon chip or substrate that has been thinned typically to 100 μm or less, followed by curing. In this case, the sheet-like prepreg can effectively eliminate or minimize the warpage of the silicon chip or the substrate. Accordingly, the sheet-like prepreg according to the present invention is also useful as a material for preventing warpage of a thinned silicon chip or a thinned substrate.

EXAMPLES

The present invention will be illustrated in further detail with reference to several examples below. It should be noted, however, that the examples are by no means intended to limit the scope of the present invention.

Preparation Example 1: Support Preparation (Cellulose Nonwoven Fabric Preparation)

Slurry of microfibrillated fiber CELISH KY110N (supplied by Daicel Corporation) was diluted to 0.2 weight percent and subjected to paper making with a No. 5C filter paper as a filter fabric, using a pressure-reducer-equipped paper machine (supplied by Toyo Seiki Seisaku-Sho Ltd., standard square machine), and yielded a wet cellulose nonwoven fabric.

The obtained wet cellulose nonwoven fabric was sandwiched between a pair of blotting papers, was pressed at a pressure of 0.2 MPa for one minute, and was then further pressed at a pressure of 0.2 MPa for one minute. Next, the resulting article was applied onto a suction drum dryer (supplied by KUMAGAI RIKI KOGYO Co., Ltd.) preset at a surface temperature of 100° C., dried for 120 seconds, and yielded a cellulose nonwoven fabric (having a porosity of 60 percent by volume, a basis weight of 9.9 g/m$^2$, a coefficient of linear thermal expansion of 5 ppm/K, and a thickness of 25 μm).

Examples 1, 2, 3, 9, and 10, and Comparative Examples 1 to 3

Sheet-Like Prepreg Production
A curable composition in the formulation given in Table 1 was prepared.

In the prepared curable composition, the cellulose nonwoven fabric obtained in Preparation Example 1 was immersed under reduced pressure to impregnate the cellulose nonwoven fabric with the curable composition, and yielded a sheet-like prepreg (including the curable composition in a proportion of 65 percent by volume). Example 9 employed a cellulose nonwoven fabric prepared by a procedure similar to that in Preparation Example 1, where this cellulose nonwoven fabric had a porosity of 60 percent by volume, a basis weight of 9.9 g/m$^2$, a coefficient of linear thermal expansion of 5 ppm/K, and a thickness of 50 μm. Example 10 employed a glass cloth instead of the cellulose nonwoven fabric.

Separately, the curable composition for use in Example 1 alone was cured to give a cured product, and the cured product was evaluated for glass transition temperature and coefficient of linear thermal expansion by measurements according to methods mentioned below. As a result, the cured product was found to have a glass transition temperature Tg of 17.5° C., a coefficient of linear thermal expansion ($\alpha_1$) of 65.8 ppm/K, and a coefficient of linear thermal expansion ($\alpha_2$) of 466.8 ppm/K.

Sheet-Like Prepreg Evaluation
The prepared sheet-like prepreg was placed between a pair of glass coated with a release agent, heated under the curing conditions given in Table 1 to give a cured product, and the resulting cured product was evaluated for glass transition temperature and coefficient of linear thermal expansion by measurements according to the following methods.

On the other hand, four 10-mm square silicon chips were repositioned on a 50-mm square glass substrate, covered with the sheet-like prepreg, and compression-molded to perform encapsulation of the silicon chips. The compression molding was performed by pressing at 1 MPa with heating under the initial curing conditions given in Table 1. Thereafter a semiconductor package including the silicon chips was removed from the substrate, and was evaluated for anti-warpage performance and cracking resistance by methods mentioned below.

Examples 4, 5, 6, 7, and 8

A curable composition was prepared in the formulation given in Table 1, was combined with methyl ethyl ketone so as to have a solids concentration of 40%, and yielded a target curable composition.

With the curable composition, the cellulose nonwoven fabric prepared in Preparation Example 1 was impregnated, and the solvent was then removed under reduced pressure. Thus, a sheet-like prepreg was prepared.

The prepared sheet-like prepreg was evaluated by methods similar to those in Example 1.

Examples 11 and 12

A filler and an epoxy resin in the formulation given in Table 1 were charged into a mortar machine (supplied by ISHIKAWA KOJO Co., Ltd.), were kneaded for 30 minutes, and yielded an epoxy resin including the filler being highly dispersed. Next, this was combined with an acid anhydride and further combined with ethylene glycol and a catalyst, followed by kneading. Finally, the kneadate was combined with methyl ethyl ketone so as to have a solids concentration of 40% and yielded a curable composition.

With the curable composition, the cellulose nonwoven fabric obtained in Preparation Example 1 was impregnated, from which the solvent was removed under reduced pressure. Thus, a sheet-like prepreg was prepared.

The prepared sheet-like prepreg was evaluated by methods similar to those in Example 1.

Glass Transition Temperature (Tg), Coefficient of Linear Thermal Expansion ($\alpha_1$) in Temperature Region Lower Than Tg, and Coefficient of Linear Thermal Expansion ($\alpha_2$) in Temperature Region Higher than Tg The glass transition temperature and coefficient of linear thermal expansion of a sample cured product were measured under conditions as follows. Measured values in second heating (2nd-heating) were employed in the individual parameters.

Figure 2:
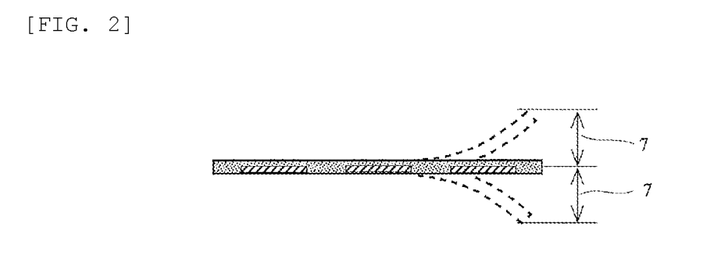
FIG. 2 is a diagram illustrating how to measure an amount of warpage.

Test specimen size: initial length 10 mm by width 3.5 mm by thickness 0.035 mm
Measuring apparatus: thermomechanical analyzer (Exstar TMA/SS7100, supplied by Hitachi High-Technologies Corporation)
Measurement mode: tensile, measurement at a constant load (40 mN)
Measurement atmosphere: nitrogen
Temperature Condition:
first heating: from −60° C. up to 120° C., 5° C./min
cooling: from 120° C. down to −60° C., 20° C./min
second heating: from −60° C. up to 220° C., 5° C./min Anti-Warpage Performance The amount of warpage of a sample semiconductor package was measured at 25° C., 150° C., and 275° C. (see FIG. 2), and the sample was evaluated for anti-warpage performance according to the following criteria:

Good: the amount of warpage is 10 μm or less all at 25° C., 150° C., and 275° C.;

Fair: the amount of warpage is from greater than 10 μm to 50 μm at at least one of 25° C., 150° C., and 275° C.; and Poor: the amount of warpage is greater than 50 μm at at least one of 25° C., 150° C., and 275° C.

Cracking Resistance

A sample semiconductor package was subjected to a heat shock test between −25° C. and 100° C. inclusive (100 times), whether cracking occurred was visually observed on the semiconductor package after the test, and the sample was evaluated for cracking resistance according to the following criteria:

Good: no cracking

Poor: cracking

TABLE 1

| | | | Molecular weight per functional group (g/eq) | Examples | | | | | | | |
|---|---|---|---|---|---|---|---|---|---|---|---|
| | | | | 1 | 2 | 3 | 4 | 5 | 6 | 7 | 8 |
| Curable composition | Epoxide | YD-128 | 188.6 | 100 | 100 | | | | | | |
| | | CELLOXIDE 2021P | 130 | | | | | | | | |
| | | EXA-4850-150 | 433 | | | 100 | 100 | | 100 | 100 | 100 |
| | | EXA-4850-1000 | 350 | | | | | 100 | | | |
| | Curing agent | RIKACID MH-700F | 164.5 | 54.9 | 39.2 | 34.2 | | | | | |
| | | RIKACID HF-08 | 672.7 | 96.3 | 160.5 | | | | | | |
| | | TD2091 | 104.0 | | | | 24.0 | 29.7 | | | |
| | | TETA | 23.4 | | | | | | | 5.39 | |
| | | D-400 | 107.0 | | | | | | 24.7 | | |
| | Diluent | EG | | 2.00 | 2.00 | 2.00 | | | | | |
| | Curing accelerator | U-CAT12XD | | 0.50 | 0.50 | 0.50 | | | | | |
| | | TPP | | | | | 1.00 | 1.00 | | | |
| | Curing catalyst | 2E4MIZ | | | | | | | | | 2.00 |
| | Filler | Silica filler | | | | | | | | | |
| | | Carbon nanotube | | | | | | | | | |
| Porous support | | Cellulose nonwoven fabric (thickness in μm) | | 25 | 25 | 25 | 25 | 25 | 25 | 25 | 25 |
| | | Glass cloth (thickness in μm) | | | | | | | | | |
| Weighted average of molecular weight per functional group | | | | 369 | 445 | 365 | 369 | 294 | 368 | 412 | 433 |
| Curing conditions | | | | 100° C. for 2 hr 150° C. for 2 hr | 100° C. for 2 hr 150° C. for 2 hr | 100° C. for 2 hr 150° C. for 2 hr | 100° C. for 2 hr 150° C. for 2 hr | 100° C. for 2 hr 150° C. for 2 hr | 85° C. for 2 hr 150° C. for 5 hr | 85° C. for 2 hr 150° C. for 2 hr | 85° C. for 2 hr 150° C. for 5 hr |
| Evaluations | | Tg (TMA) (° C.) | | 40.0 | 27.0 | 38.0 | 44.0 | 76.0 | 18.0 | 30.0 | 23.0 |
| | | $\alpha_1$ (ppm/K) | | 15.0 | 10.0 | 14.0 | 25.0 | 49.0 | 18.0 | 12.0 | 15.0 |
| | | $\alpha_2$ (ppm/K) | | 8.4 | 7.0 | 8.0 | 9.0 | 15.0 | 6.9 | 7.0 | 8.0 |
| | | Anti-warpage performance | | Good | Good | Good | Good | Fair | Good | Good | Good |
| | | Cracking resistance | | Good | Good | Good | Good | Good | Good | Good | Good |

| | | | Molecular weight per functional group (g/eq) | Examples | | | | Comparative Examples | | |
|---|---|---|---|---|---|---|---|---|---|---|
| | | | | 9 | 10 | 11 | 12 | 1 | 2 | 3 |
| Curable composition | Epoxide | YD-128 | 188.6 | 100 | 100 | 100 | 100 | | 100 | |
| | | CELLOXIDE 2021P | 130 | | | | | 100 | | 100 |
| | | EXA-4850-150 | 433 | | | | | | | |
| | | EXA-4850-1000 | 350 | | | | | | | |
| | Curing agent | RIKACID MH-700F | 164.5 | 54.9 | 54.9 | 54.9 | 54.9 | 126.5 | 87.2 | 126.5 |
| | | RIKACID HF-08 | 672.7 | 96.3 | 96.3 | 96.3 | 96.3 | | | |
| | | TD2091 | 104.0 | | | | | | | |
| | | TETA | 23.4 | | | | | | | |
| | | D-400 | 107.0 | | | | | | | |
| | Diluent | EG | | 2.00 | 2.00 | 2.00 | 2.00 | 2.0 | 2.0 | 2.0 |
| | Curing accelerator | U-CAT12XD | | 0.50 | 0.50 | 0.50 | 0.50 | 0.5 | 0.5 | 0.5 |
| | | TPP | | | | | | | | |
| | Curing catalyst | 2E4MIZ | | | | | | | | |
| | Filler | Silica filler | | | | | 40 | | | 40 |
| | | Carbon nanotube | | | | | 5 | | | |
| Porous support | | Cellulose nonwoven fabric (thickness in μm) | | 50 | | 25 | 25 | 25 | 25 | 25 |
| | | Glass cloth (thickness in μm) | | | 25 | | | | | |
| Weighted average of molecular weight per functional group | | | | 369 | 369 | 369 | 369 | 149 | 177 | 149 |
| Curing conditions | | | | 100° C. for 2 hr 150° C. for 2 hr | 100° C. for 2 hr 150° C. for 2 hr | 100° C. for 2 hr 150° C. for 2 hr | 100° C. for 2 hr 150° C. for 2 hr | 100° C. for 2 hr 150° C. for 2 hr | 100° C. for 2 hr 150° C. for 2 hr | 100° C. for 2 hr 150° C. for 2 hr |

TABLE 1-continued

| Evaluations | | | | | | | | |
|---|---|---|---|---|---|---|---|---|
| | Tg (TMA) (° C.) | 41.0 | 43.0 | 50.0 | 45.0 | 189.0 | 127.0 | 135.0 |
| | $\alpha_1$ (ppm/K) | 15.0 | 18.0 | 13.0 | 12.0 | 56.0 | 56.0 | 35.0 |
| | $\alpha_2$ (ppm/K) | 8.4 | 9.0 | 7.0 | 7.0 | 35.0 | 25.0 | 20.0 |
| | Anti-warpage performance | Good | Good | Good | Good | Poor | Poor | Poor |
| | Cracking resistance | Good | Good | Good | Good | Poor | Poor | Poor |

Epoxide

YD-128: Bisphenol-A diglycidyl ether (having a weight per epoxy equivalent of 190, a viscosity of 13600 MPa-s/25° C.), having a weight per epoxy equivalent of 188.6, supplied by NIPPON STEEL & SUMIKIN CHEMICAL CO., LTD.

CELLOXIDE 2021P: 3,4-Epoxycyclohexylmethyl (3,4-epoxy)cyclohexanecarboxylate, having a weight per epoxy equivalent of 130, supplied by Daicel Corporation EXA-4850-150: Modified epi-bis glycidyl ether epoxy resin, having a weight per epoxy equivalent of 433, trade name EPICLON EXA-4850-150, supplied by DIC Corporation EXA-4850-1000: Modified epi-bis glycidyl ether epoxy resin represented by Formula (ii-1), having a weight per epoxy equivalent of 350, trade name EPICLON EXA-4850-1000, supplied by DIC Corporation, where Formula (ii-1) is expressed as follows:

[Chem. 5]

(ii-1)

Curing Agents

RIKACID MH-700: Methylhexahydrophthalic anhydride, having an acid anhydride equivalent of 164.5, supplied by New Japan Chemical Co., Ltd.

RIKACID HF-08: Ester (dicarboxylic acid) between an alicyclic acid anhydride and a polyalkylene glycol, having a carboxyl equivalent of 672.7, supplied by New Japan Chemical Co., Ltd.

TD2091: Phenol novolac, having a hydroxyl equivalent of 104.0, supplied by DIC Corporation TETA: Triethyltetramine, having an amine equivalent of 23.4, supplied by Mitsui Fine Chemicals Inc.

D-400: Polyoxyalkylenediamine, having an amine equivalent of 107.0, supplied by Mitsui Fine Chemicals Inc.

Diluent

EG: Ethylene glycol, supplied by Wako Pure Chemical Industries, Ltd.

Curing Accelerator

U-CAT 12XD: Special amine catalyst, supplied by San-Apro Ltd.

TPP: Triphenylphosphine, supplied by Wako Pure Chemical Industries, Ltd.

Curing Catalyst

2E4MIZ: 2-Ethyl-4-methylimidazole, supplied by Wako Pure Chemical Industries, Ltd.

Filler

Silica filler: having a particle diameter of 3 μm or less, supplied by Nippon Electric Glass Co., Ltd.

Carbon nanotube: having a length of 10 μm or more and a diameter of 20 to 45 nm, supplied by GLONATECH S.A.

Porous Support

Glass cloth: having a porosity of 62 percent by volume, a basis weight of 24 g/m$^2$, a coefficient of linear thermal expansion of 3 ppm/k, and a thickness of 25 μm, trade name 1037, supplied by Toyobo Co. Ltd.

As a summary of the above description, the configurations according to embodiments of the present invention, as well as variations thereof, will be listed below as appendices.

(1) A sheet-like prepreg including a curable composition and a sheet-like porous support impregnated with the curable composition, the sheet-like porous support being made from a material having a coefficient of linear thermal expansion of 10 ppm/K or less, the sheet-like prepreg giving a cured product having a glass transition temperature of from −60° C. to 100° C., the curable composition being a composition containing one or more curable compounds (A) and at least one of a curing agent (B) and a curing catalyst (C), the curable compounds (A) including an epoxide having a weight per epoxy equivalent of 140 to 3000 g/eq in a proportion of 50 weight percent or more of the totality of the curable compounds (A).

(2) The sheet-like prepreg according to (1), wherein the cured product of the sheet-like prepreg is one resulting from heat treatment through heating at a temperature of 40° C. to 300° C. for a duration of 1 to 10 hours.

(3) The sheet-like prepreg according to one of (1) and (2), wherein the material constituting the sheet-like porous support has a coefficient of linear thermal expansion of 7 ppm/K or less (and particularly preferably 5 ppm/K or less).

(4) The sheet-like prepreg according to any one of (1) to (3), wherein the material having a coefficient of linear thermal expansion of 10 ppm/K or less is at least one selected from paper, celluloses, glass fibers, and liquid crystal materials.

(5) The sheet-like prepreg according to any one of (1) to (4), wherein the porous support has a porosity of 90 to 10 percent by volume (preferably 80 to 30 percent by volume, particularly preferably 70 to 30 percent by volume, and most preferably 70 to 50 percent by volume), and the porous support has a thickness of 5 to 500 μm (preferably 10 μm or more, particularly preferably 15 μm or more, and most preferably 20 μm or more; and preferably 300 μm or less, more preferably 200 μm or less, particularly preferably 100 μm or less, and most preferably 75 μm or less).

(6) The sheet-like prepreg according to any one of (1) to (5), wherein the curable compounds (A) include the epoxide having a weight per epoxy equivalent (g/eq) of 140 to 3000 (preferably 170 to 1000, more preferably 180 to 1000, and particularly preferably 180 to 500) in an amount of 50 weight percent or more (preferably 70 weight percent or more, particularly preferably 80 weight percent or more, and most preferably 90 weight percent or more (each 100 weight percent or less) of the totality of the curable compounds (A).

(7) The sheet-like prepreg according to any one of (1) to (6), wherein the curable composition includes, as the epoxide, at least one selected from the group consisting of cycloaliphatic epoxides, aromatic epoxides (such as epi-bis glycidyl ether epoxy resins, high-molecular-weight epi-bis glycidyl ether epoxy resins, and modified epi-bis glycidyl ether epoxy resins), and aliphatic epoxides.

(8) The sheet-like prepreg according to (7), wherein the modified epi-bis glycidyl ether epoxy resins are compounds represented by Formula (ii), in which $R^1$ to $R^4$ each represent, identically or differently in each occurrence, hydrogen or a hydrocarbon group; k represents an integer of 1 or more; $L^1$ represents, independently in each occurrence, a low-polarity linking group; and $L^2$ represents a flexible skeleton.

(9) The sheet-like prepreg according to any one of (1) to (8), wherein the curing agent (B) is at least one compound selected from the group consisting of acid anhydrides (b-1), dicarboxylic acids (b-2), amines (b-3), and phenols (b-4).

(10) The sheet-like prepreg according to any one of (1) to (9), wherein the curable composition has a content of the curable compound (A) of 30 to 98 weight percent of the totality of the curable composition, a content of an aromatic epoxide or epoxides (such as a compound selected from epi-bis glycidyl ether epoxy resins, high-molecular-weight epi-bis glycidyl ether epoxy resins, and modified epi-bis glycidyl ether epoxy resins) of 30 to 98 weight percent of the totality of the curable composition, and a content of epoxides other than aromatic epoxides of 20 weight percent or less (preferably 10 weight percent or less, particularly preferably 5 weight percent or less, and most preferably 1 weight percent or less) of the totality of the curable composition.

(11) The sheet-like prepreg according to any one of (1) to (10), wherein an aromatic epoxide (such as a compound selected from epi-bis glycidyl ether epoxy resins, high-molecular-weight epi-bis glycidyl ether epoxy resins, and modified epi-bis glycidyl ether epoxy resins) is present in a proportion of 60 weight percent or more (preferably 70 weight percent or more, particularly preferably 80 weight percent or more, and most preferably 90 weight percent or more; and each 100 weight percent or less) of the totality of all epoxides contained in the curable composition.

(12) The sheet-like prepreg according to any one of (1) to (11), wherein the curable composition contains the curing agent (B) in such a proportion that a reactive group or groups of the curing agent (B) is present in a proportion of 0.8 to 1.2 moles per mole of a curable group or groups of the curable compounds (A).

(13) The sheet-like prepreg according to any one of (1) to (12), wherein the curable composition contains the curing catalyst (C) in a proportion of 0.1 to 10 parts by weight per 100 parts by weight of the curable compounds (A).

(14) The sheet-like prepreg according to any one of (1) to (13), wherein the curable composition has a weighted average of molecular weight per functional group of all curable compounds (A) (all curable compounds (A) and all curing agents (B) when the curable composition also contains one or more curing agents (B)) of 180 to 1000 (preferably 200 to 700, particularly preferably 200 to 500, especially preferably 250 to 450, and most preferably 300 to 450) g/eq.

(15) The sheet-like prepreg according to any one of (1) to (14), wherein a cured product of the curable composition has a coefficient of linear thermal expansion of 100 ppm/K or more (typically 100 to 700 ppm/K, preferably 200 to 500 ppm/K, and particularly preferably 300 to 500 ppm/K).

(16) The sheet-like prepreg according to any one of (1) to (15), wherein the cured product of the sheet-like prepreg has a coefficient of linear thermal expansion of 55 ppm/K or less (typically −1 to 55 ppm/K, preferably 50 ppm/K or less, more preferably 45 ppm/K or less, furthermore preferably 25 ppm/K or less, and particularly preferably 20 ppm/K or less).

(17) The sheet-like prepreg according to any one of (1) to (16), wherein the curable composition has a total content of the curable compound (A) and the curing agent (B) of 80 weight percent or more (preferably 90 weight percent or more, and particularly preferably 95 weight percent or more) of the totality of the curable composition (excluding a filler (D)).

(18) The sheet-like prepreg according to any one of (1) to (17), wherein the curable composition contains a filler (D) in a proportion of 50 parts by weight or less (typically 1 to 50 parts by weight, preferably 45 parts by weight or less, and particularly preferably 40 parts by weight or less) per 100 parts by weight of the curable compound (A).

(19) The sheet-like prepreg according to any one of (1) to (18), wherein the cured product has a glass transition temperature (Tg) of −60° C. to 100° C. (preferably 50° C. or lower, particularly preferably 40° C. or lower, and most preferably 25° C. or lower; and preferably −40° C. or higher, more preferably −30° C. or higher, furthermore preferably −20° C. or higher, still more preferably −10° C. or higher, particularly preferably 0° C. or higher, especially preferably 5° C. or higher, and most preferably 10° C. or higher).

(20) The sheet-like prepreg according to any one of (1) to (19), wherein the cured product has a coefficient of linear thermal expansion of 100 ppm/K or more (typically 100 to 700 ppm/K, preferably 200 to 500 ppm/K, and particularly preferably 300 to 500 ppm/K) at at least one temperature in the range of equal to or higher than the glass transition temperature (typically −10° C. to 220° C., preferably 0° C. to 220° C., particularly preferably 10° C. to 200° C., especially preferably 20° C. to 220° C., and most preferably 50° C. to 220° C.)

(21) The sheet-like prepreg according to any one of (1) to (20), wherein the sheet-like porous support has a thickness of 5 to 500 μm.

(22) The sheet-like prepreg according to any one of (1) to (21), which is an encapsulant for compression molding.

(23) The sheet-like prepreg according to any one of (1) to (22), which is an encapsulant for fan-out wafer-level packaging.

(24) The sheet-like prepreg according to any one of (1) to (23), which is a material for preventing warpage of a thinned silicon chip or thinned substrate having a thickness of 100 μm or less.

INDUSTRIAL APPLICABILITY

The sheet-like prepreg according to the present invention can give, by heat cure, a cured product that has appropriate flexibility, less thermally shrinks and expands (has a low shrinkage percentage and a low thermal expansion coefficient), and can offer excellent anti-warpage performance and cracking resistance. The sheet-like prepreg according to the present invention is therefore advantageously usable as an encapsulant for FOWLP and a material for substrate warpage prevention.

REFERENCE SIGNS LIST 1 support
2 temporary tape
3 chip
4 sheet-like prepreg
5 surface flattening substrate
6 semiconductor package
7 amount of warpage

The invention claimed is:

1. A sheet-shaped prepreg comprising:
a curable composition; and
a sheet-shaped porous support impregnated with the curable composition, the sheet-shaped porous support being made from a cellulose,
the sheet-shaped prepreg giving a cured product having a glass transition temperature of from −60° C. to 80° C.,
the curable composition comprising:
(A) one or more curable compounds; and
(C) a curing catalyst,
the one or more curable compounds (A) comprising an epoxide having a weight per epoxy equivalent of 188.6 to 3000 g/eq in an amount of 50 weight percent or more of the totality of the one or more curable compounds (A), and
a weighted average of molecular weight per functional group of all the curable compounds (A) being 300 to 1000 g/eq.

2. The sheet-shaped prepreg according to claim 1, wherein the curable composition comprises the curing catalyst (C) in a proportion of 0.1 to 10 parts per 100 parts by weight of the one or more curable compounds (A).

3. The sheet-shaped prepreg according to claim 1, wherein a cured product of the curable composition has a coefficient of linear thermal expansion of 100 ppm/K or more, and the cured product of the sheet-shaped prepreg has a coefficient of linear thermal expansion of 55 ppm/K or less.

4. The sheet-shaped prepreg according to claim 1, wherein the curable composition further comprises a filler (D) in a proportion of 1 to 50 parts by weight per 100 parts by weight of the one or more curable compounds (A).

5. The sheet-shaped prepreg according to claim 1, wherein the sheet-shaped porous support has a thickness of 5 to 500 μm.

6. The sheet-shaped prepreg according to claim 1, which is an encapsulant for compression molding.

7. The sheet-shaped prepreg according to claim 1, which is an encapsulant for fan-out wafer-level packaging.

8. The sheet-shaped prepreg according to claim 1, which is a material for preventing warpage of a thinned silicon chip or thinned substrate having a thickness of 100 μm or less.

9. A method for producing an encapsulant for compression molding, comprising
using the sheet-shaped prepreg according to claim 1.

10. A method for producing an encapsulant for fan-out wafer-level packaging, comprising
using the sheet-shaped prepreg according to claim 1.

11. A method for producing a material for preventing warpage of a thinned silicon chip or thinned substrate having a thickness of 100 μm or less, comprising
using the sheet-shaped prepreg according to claim 1.

12. The sheet-shaped prepreg according to claim 1,
wherein the curable composition further comprises a filler (D) in a proportion of 1 to 50 parts by weight per 100 parts by weight of the one or more curable compounds (A),
a cured product of the curable composition has a coefficient of linear thermal expansion of 100 ppm/K or more, and
the cured product of the sheet-shaped prepreg has a coefficient of linear thermal expansion of 55 ppm/K or less.

13. The sheet-shaped prepreg according to claim 1,
wherein a cured product of the curable composition has a coefficient of linear thermal expansion of 100 ppm/K or more,
the cured product of the sheet-shaped prepreg has a coefficient of linear thermal expansion of 55 ppm/K or less, and
the sheet-shaped porous support has a thickness of 5 to 500 μm.

14. The sheet-shaped prepreg according to claim 1,
wherein the curable composition further comprises a filler (D) in a proportion of 1 to 50 parts by weight per 100 parts by weight of the one or more curable compounds (A), and
the sheet-shaped porous support has a thickness of 5 to 500 μm.

15. The sheet-shaped prepreg according to claim 1,
wherein the curable composition further comprises a filler (D) in a proportion of 1 to 50 parts by weight per 100 parts by weight of the one or more curable compounds (A),
a cured product of the curable composition has a coefficient of linear thermal expansion of 100 ppm/K or more,
the cured product of the sheet-shaped prepreg has a coefficient of linear thermal expansion of 55 ppm/K or less, and
the sheet-shaped porous support has a thickness of 5 to 500 μm.

16. The sheet-shaped prepreg according to claim 1,
wherein the sheet-shaped porous support has a porosity of 70 to 50 percent by volume.

17. A sheet-shaped prepreg comprising:
a curable composition; and
a sheet-shaped porous support impregnated with the curable composition, the sheet-shaped porous support being made from a cellulose,
the sheet-shaped prepreg giving a cured product having a glass transition temperature of from −60° C. to 80° C.,
the curable composition comprising:
(A) one or more curable compounds; and
(B) a curing agent,
the one or more curable compounds (A) comprising an epoxide having a weight per epoxy equivalent of 188.6 to 3000 g/eq in an amount of 50 weight percent or more of the totality of the one or more curable compounds (A), and
a weighted average of molecular weight per functional group of all the curable compounds (A) and the curing agent (B) is being 300 to 1000 g/eq.

18. The sheet-shaped prepreg according to claim 17, wherein the curable composition comprises the curing agent (B) in such a proportion that a reactive group or groups of the curing agent (B) are present in an amount of 0.8 to 1.2 moles per mole of a curable group or groups of the one or more curable compounds (A).

* * * * *